US006798360B1

(12) United States Patent
Qian et al.

(10) Patent No.: US 6,798,360 B1
(45) Date of Patent: Sep. 28, 2004

(54) METHOD AND SYSTEM FOR COMPRESSING A CONTINUOUS DATA FLOW IN REAL-TIME USING RECURSIVE HIERARCHICAL SELF-ORGANIZING CLUSTER VECTOR QUANTIZATION (HSOCVQ)

(75) Inventors: Shen-En Qian, Brossard (CA); Allan B. Hollinger, Toronto (CA)

(73) Assignee: Canadian Space Agency, St-Hubert (CA)

( * ) Notice: Subject to any disclaimer, the term of this patent is extended or adjusted under 35 U.S.C. 154(b) by 0 days.

(21) Appl. No.: 10/606,761

(22) Filed: Jun. 27, 2003

(51) Int. Cl.[7] .................................................. H03M 7/00
(52) U.S. Cl. ............................ 341/50; 341/51; 341/106
(58) Field of Search ............................. 341/50, 51, 59, 341/65, 67, 79, 106, 107; 375/240.12, 240.22, 241

(56) References Cited

U.S. PATENT DOCUMENTS

| | | | | |
|---|---|---|---|---|
| 4,727,354 A | * | 2/1988 | Lindsay ....................... 341/106 |
| 5,255,090 A | * | 10/1993 | Israelsen ................. 375/240.12 |
| 5,371,544 A | * | 12/1994 | Jacquin et al. .......... 375/240.11 |
| 5,396,625 A | * | 3/1995 | Parkes ............................. 707/1 |
| 5,477,221 A | * | 12/1995 | Chang et al. .................. 341/51 |
| 5,519,394 A | * | 5/1996 | Matsuo et al. ................. 341/51 |
| 5,541,594 A | * | 7/1996 | Huang et al. .................. 341/51 |
| 5,640,159 A | * | 6/1997 | Furlan et al. .................. 341/51 |
| 5,673,042 A | * | 9/1997 | Yoshida et al. ................ 341/51 |
| 6,198,412 B1 | * | 3/2001 | Goyal ............................ 341/50 |
| 6,650,256 B2 | * | 11/2003 | Kondo et al. .................. 341/50 |

* cited by examiner

*Primary Examiner*—Michael Tokar
*Assistant Examiner*—Linh Vu Nguyen
(74) *Attorney, Agent, or Firm*—Freedman & Associates

(57) ABSTRACT

The present invention relates to a method for compressing a continuous data flow based on lossy compression. In real-time data compression, a series of data subsets acquired in a given period of time are treated as a regional data cube for the purpose of dividing a continuous series of data subsets into a plurality of data cubes. Reuse of existing codevectors is important in achieving high compression performance. For encoding spectral vectors on a subset-by-subset basis in a current region two types of codevectors are used, codevectors that have been newly trained for previous data subsets in the current region and codevectors trained for the previous region. The problem of a visible spatial boundary between two adjacent regions after decompression is overcome by reusing the codevectors trained from a previous region to encode the spectral vectors in the current region in order to attain a seamless conjunction of the two adjacent regions. Experimental results show that the method for compressing a continuous data flow in real-time according to the present invention performs as well as data compression performed in batch mode. Therefore, the method is highly advantageous in, for example, space applications or medical imaging.

31 Claims, 8 Drawing Sheets

METHOD AND SYSTEM FOR COMPRESSING A CONTINUOUS DATA FLOW IN REAL-TIME USING RECURSIVE HIERARCHICAL SELF-ORGANIZING CLUSTER VECTOR QUANTIZATION (HSOCVQ)

FIELD OF THE INVENTION

The invention relates to data compression and more particularly to compression of a continuous flow of multi-dimensional data in real-time using vector quantization.

BACKGROUND OF THE INVENTION

The next generation of satellite-based remote sensing instruments will produce an unprecedented volume of data. Imaging spectrometers, also known as hyper-spectral imaging devices, are prime examples. They collect image data in hundreds of spectral bands simultaneously from the near ultraviolet to the short wave infrared, and are capable of providing direct identification of surface materials.

Hyper-spectral data thus collected are typically in the form of a three-dimensional (3D) data cube. Each data cube has two dimensions in the spatial domain defining a rectangular plane of image pixels, and a third dimension in the spectral domain defining radiance levels of multiple spectral bands per each image pixel. The volume and complexity of hyper-spectral data present a significant challenge to conventional transmission and image analysis methods.

Data compression using Vector Quantisation (VQ) has received much attention because of its promise of high compression ratio and relatively simple structure. The VQ procedure is known to have two main steps: codebook generation and codevector matching. VQ can be viewed as mapping a large set of vectors into a small cluster of indexed codevectors forming a codebook. During encoding, a search through a codebook is performed to find a best codevector to express each input vector. The index or address of the selected codevector in the codebook is stored associated with the input vector or the input vector location. Given two systems having a same codebook, transmission of the index to a decoder over a communication channel from the first system to the second other system allows a decoder within the second other system to retrieve the same codevector from an identical codebook. This is a reconstructed approximation of the corresponding input vector. Compression is thus obtained by transmitting the index of the codevector rather the codevector itself.

In an article entitled "Lossy Compression of Hyperspectral Data Using Vector Quantization" by Michael Ryan and John Arnold in the journal Remote Sens. Environ., Elsevier Science Inc., New York, N.Y., 1997, Vol. 61, pp. 419–436, an overview of known general vector quantization techniques is presented. The article is herein incorporated by reference. In particular, the authors describe issues such as distortion measures and classification issues arising from lossy compression of hyper-spectral data using vector quantization.

However, implementation of a lossy compression method such as the VQ for real-time data compression of a continuous data flow is substantially complicated due to the fact that the complete hyper-spectral data cube is not available for compression. In real-time compression onboard a satellite, hyper-spectral data corresponding to only a 2D focal plane frame sensed at a given moment from a swath target—across track line—on ground is available together with the hyper-spectral data corresponding to 2D focal plane frames sensed before. One—spatial—dimension of the 2D focal plane frame corresponds to a line of ground samples—called ground pixels, and another dimension of the 2D focal plane frame corresponds to a spectrum expansion of each ground pixel in wavelength. The spectrum expansion of a ground pixel is referred to as a "spectral vector." A focal plane frame comprises a same number of spectral vectors and ground pixels. The second spatial dimension of the hyper-spectral data cube is obtained by sensing successive swath targets in along-track direction of the moving satellite producing successive 2D focal plane frames.

Therefore, it is only possible to apply the compression to successive 2D plane frames or successive regions comprising several 2D plane frames substantially inhibiting successful application of lossy compression such as VQ at high compression ratios with excellent fidelity. Furthermore, application of conventional lossy compression methods on datacubes representative of regions results in visible artifacts at the boundaries between different regions when the data is uncompressed and severely affects image quality after decompression.

SUMMARY OF THE INVENTION

It is, therefore, an object of the present invention to provide a method for compression of a continuous data flow based on a lossy compression method.

It is further an object of the present invention to provide a method for pipeline compression of a continuous data flow having a high compression ratio and without image artifacts.

It is yet another object of the present invention to provide a system for data compression of a continuous data flow.

In data compression, a series of 2D data subsets acquired in a given period of time are treated as a regional data cube for the purpose of dividing a continuous series of 2D data subsets into a plurality of data cubes. Reuse of existing codevectors is important in achieving high compression performance. For encoding spectral vectors on a subset-by-subset basis in a current region, two types of codevectors are used: codevectors that have been newly trained for data subsets in the current region and codevectors trained for the previous region. The problem of a visible spatial boundary between two adjacent regions after decompression is overcome by reusing the codevectors trained from a previous region to encode the spectral vectors in the current region in order to attain a seamless conjunction of the two adjacent regions. Experimental results show that the method for compressing a continuous data flow according to the present invention performs as well as data compression performed in batch mode. Therefore, the method is highly advantageous in, for example, space applications or medical imaging.

In accordance with the invention there is provided, a method for compression of a continuous data flow comprising the steps of:

a) receiving a $n^{th}$ data subset of the continuous data flow, the $n^{th}$ data subset comprising a plurality of data vectors indicative of a $n^{th}$ portion of an image of an object;

b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;

c) determining a fidelity for the approximation of each data vector of the $n^{th}$ data subset;

d) when the fidelity for the approximation of a data vector of the $n^{th}$ data subset is above a predetermined threshold performing the step of encoding the data vector based on the selected codevector;

e) repeating the steps a) to d) for encoding data vectors of subsequent data subsets;

f) collecting un-encoded data vectors;

g) determining at least a codevector through training for approximating the un-encoded data vectors with a fidelity above the predetermined threshold based on the collected un-encoded data vectors;

i) storing the at least a trained codevector in the respective codebook; and, j) encoding the un-encoded data vectors based on the at least a trained codevector.

In accordance with the invention there is further provided, a method for compression of a continuous data flow comprising the steps of:

a) receiving a $n^{th}$ data subset of a $m^{th}$ region of the continuous data flow, the $n^{th}$ data subset comprising a plurality of data vectors indicative of a $n^{th}$ portion of the $m^{th}$ region of an image of an object;

b) selecting for each data vector of the $n^{th}$ data subset of the $m^{th}$ region a codevector from a $m^{th}$ regional codebook that approximates the respective data vector, the $m^{th}$ regional codebook comprising codevectors for encoding at least a portion of the data vectors of at least a data subset of the first to the $n-1^{th}$ data subsets of the $m^{th}$ region;

c) determining a fidelity for the approximation of each data vector of the $n^{th}$ data subset of the $m^{th}$ region;

d) when the fidelity for the approximation of a data vector of the $n^{th}$ data subset of the $m^{th}$ region is above a predetermined threshold performing the step of encoding the data vector based on the selected codevector;

e) when the fidelity for the approximation of a data vector of the $n^{th}$ data subset of the $m^{th}$ region is below the predetermined threshold performing the step of selecting a second codevector from the $m-1^{th}$ regional codebook that approximates the data vector;

f) determining a fidelity for the second approximation of the data vector;

g) when the fidelity for the second approximation of the data vector is above the predetermined threshold performing the step of encoding the data vector based on the selected second codevector;

h) repeating the steps a) to g) for encoding data vectors of subsequent data subsets within the $m^{th}$ region;

i) collecting un-encoded data vectors of subsequent data subsets;

j) determining at least a codevector through training for approximating each of the un-encoded data vectors with a fidelity above the predetermined threshold based on the collected un-encoded data vectors;

k) storing the at least a trained codevector in the $m^{th}$ regional codebook;

l) encoding the un-encoded data vectors based on the at least a trained codevector;

m) storing in the $m^{th}$ regional index map at least an index indicative of the at least a trained codevector's location within the $m^{th}$ regional codebook; and, n) providing the $m^{th}$ regional codebook and the $m^{th}$ regional index map for transmission.

In accordance with an aspect of the invention there is provided, a storage medium having stored thereon at least an executable command for when executed resulting in performance of the steps of:

a) receiving a $n^{th}$ data subset of a $m^{th}$ region of the continuous data flow, the $n^{th}$ data subset comprising a plurality of data vectors indicative of a $n^{th}$ portion of the $m^{th}$ region of an image of an object;

b) selecting for each data vector of the $n^{th}$ data subset of the $m^{th}$ region a codevector from a $m^{th}$ regional codebook that approximates the respective data vector, the $m^{th}$ regional codebook comprising codevectors for encoding at least a portion of the data vectors of the first to the $n-1^{th}$ data subsets of the $m^{th}$ region;

c) determining a fidelity for the approximation of each data vector of the $n^{th}$ data subset of the $m^{th}$ region;

d) when the fidelity for the approximation of a data vector of the $n^{th}$ data subset of the $m^{th}$ region is above a predetermined threshold performing the step of encoding the data vector based on the selected codevector;

e) when the fidelity for the approximation of a data vector of the $n^{th}$ data subset of the $m^{th}$ region is below the predetermined threshold performing the step of selecting a second codevector from the $m-1^{th}$ regional codebook that approximates the data vector;

f) determining a fidelity for the second approximation of the data vector;

g) when the fidelity for the second approximation of the data vector is above the predetermined threshold performing the step of encoding the data vector based on the selected second codevector;

h) repeating the steps a) to g) for encoding data vectors of subsequent data subsets within the $m^{th}$ region;

i) collecting un-encoded data vectors of subsequent data subsets;

j) determining at least a codevector through training for approximating each of the un-encoded data vectors with a fidelity above the predetermined threshold based on the collected un-encoded data vectors;

k) storing the at least a trained codevector in the $m^{th}$ regional codebook; and, l) encoding the un-encoded data vectors based on the at least a trained codevector;

n) providing the $m^{th}$ regional codebook and the $m^{th}$ regional index map for transmission; and, repeating the steps h) to n) for subsequent regions.

In accordance with an aspect of the invention there is provided, a system for compressing a continuous data flow comprising: a first port for receiving the continuous data flow; electronic circuitry in data communication with the first port, the electronic circuitry for performing the steps of:

a) receiving a $n^{th}$ data subset of a $m^{th}$ region of the continuous data flow, the $n^{th}$ data subset comprising a plurality of data vectors indicative of a $n^{th}$ portion of the $m^{th}$ region of an image of an object;

b) selecting for each data vector of the $n^{th}$ data subset of the $m^{th}$ region a codevector from a $m^{th}$ regional codebook that approximates the respective data vector, the $m^{th}$ regional codebook comprising codevectors for encoding at least a portion of the data vectors of the first to the $n-1^{th}$ data subsets of the $m^{th}$ region;

c) determining a fidelity for the approximation of each data vector of the $n^{th}$ data subset of the $m^{th}$ region;

d) when the fidelity for the approximation of a data vector of the $n^{th}$ data subset of the $m^{th}$ region is above a predetermined threshold performing the step of encoding the data vector based on the selected codevector;

e) when the fidelity for the approximation of a data vector of the $n^{th}$ data subset of the $m^{th}$ region is below the predetermined threshold performing the step of selecting a second codevector from the $m-1^{th}$ regional codebook that approximates the data vector;

f) determining a fidelity for the second approximation of the data vector;

g) when the fidelity for the second approximation of the data vector is above the predetermined threshold performing the step of encoding the data vector based on the selected second codevector;

h) repeating the steps a) to g) for encoding data vectors of subsequent data subsets within the $m^{th}$ region;

i) collecting un-encoded data vectors of subsequent data subsets;

j) determining at least a codevector through training for approximating each of the un-encoded data vectors with a fidelity above the predetermined threshold based on the collected un-encoded data vectors;

k) storing the at least a trained codevector in the $m^{th}$ regional codebook;

l) encoding the un-encoded data vectors based on the at least a trained codevector;

n) providing the $m^{th}$ regional codebook and the $m^{th}$ regional index map for transmission; and, repeating the steps h) to n) for subsequent regions; and, a second port in data communication with the electronic circuitry for providing the regional codebook and the regional index map.

In accordance with the aspect of the invention there is further provided, a storage medium having stored thereon at least an executable command for when executed resulting in performance of the steps of:

a) receiving a $n^{th}$ data subset of the continuous data flow, the $n^{th}$ data subset comprising a plurality of data vectors indicative of a $n^{th}$ portion of an image of an object;

b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;

c) determining a fidelity for the approximation of each data vector of the $n^{th}$ data subset;

d) when the fidelity for the approximation of a data vector of the $n^{th}$ data subset is above a predetermined threshold performing the step of encoding the data vector based on the selected codevector;

e) repeating the steps a) to d) for encoding data vectors of subsequent data subsets;

f) collecting un-encoded data vectors;

g) determining at least a codevector through training for approximating each of the un-encoded data vectors with a fidelity above the predetermined threshold based on the collected un-encoded data vectors;

i) storing the at least a trained codevector in the respective codebook;

j) encoding the un-encoded data vectors based on the at least a trained codevector; and, storing in an index map an index indicative of a codevector's location within the respective codebook.

In accordance with the aspect of the invention there is further provided, a system for compressing a continuous data flow comprising: a first port for receiving the continuous data flow; electronic circuitry in data communication with the first port, the electronic circuitry for performing the steps of:

a) receiving a $n^{th}$ data subset of the continuous data flow, the $n^{th}$ data subset comprising a plurality of data vectors indicative of a $n^{th}$ portion of an image of an object;

b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;

c) determining a fidelity for the approximation of each data vector of the $n^{th}$ data subset;

d) when the fidelity for the approximation of a data vector of the $n^{th}$ data subset is above a predetermined threshold performing the step of encoding the data vector based on the selected codevector;

e) repeating the steps a) to d) for encoding data vectors of subsequent data subsets;

f) collecting un-encoded data vectors;

g) determining at least a codevector through training for approximating each of the un-encoded data vectors with a fidelity above the predetermined threshold based on the collected un-encoded data vectors;

i) storing the at least a trained codevector in the respective codebook;

j) encoding the un-encoded data vectors based on the at least a trained codevector; and, storing in an index map an index indicative of a codevector's location within the respective codebook; and, a second port in data communication with the electronic circuitry for providing the codebook and the index map.

BRIEF DESCRIPTION OF THE DRAWINGS

Exemplary embodiments of the invention will now be described in conjunction with the drawings in which.

DETAILED DESCRIPTION OF THE INVENTION

Figure 1:
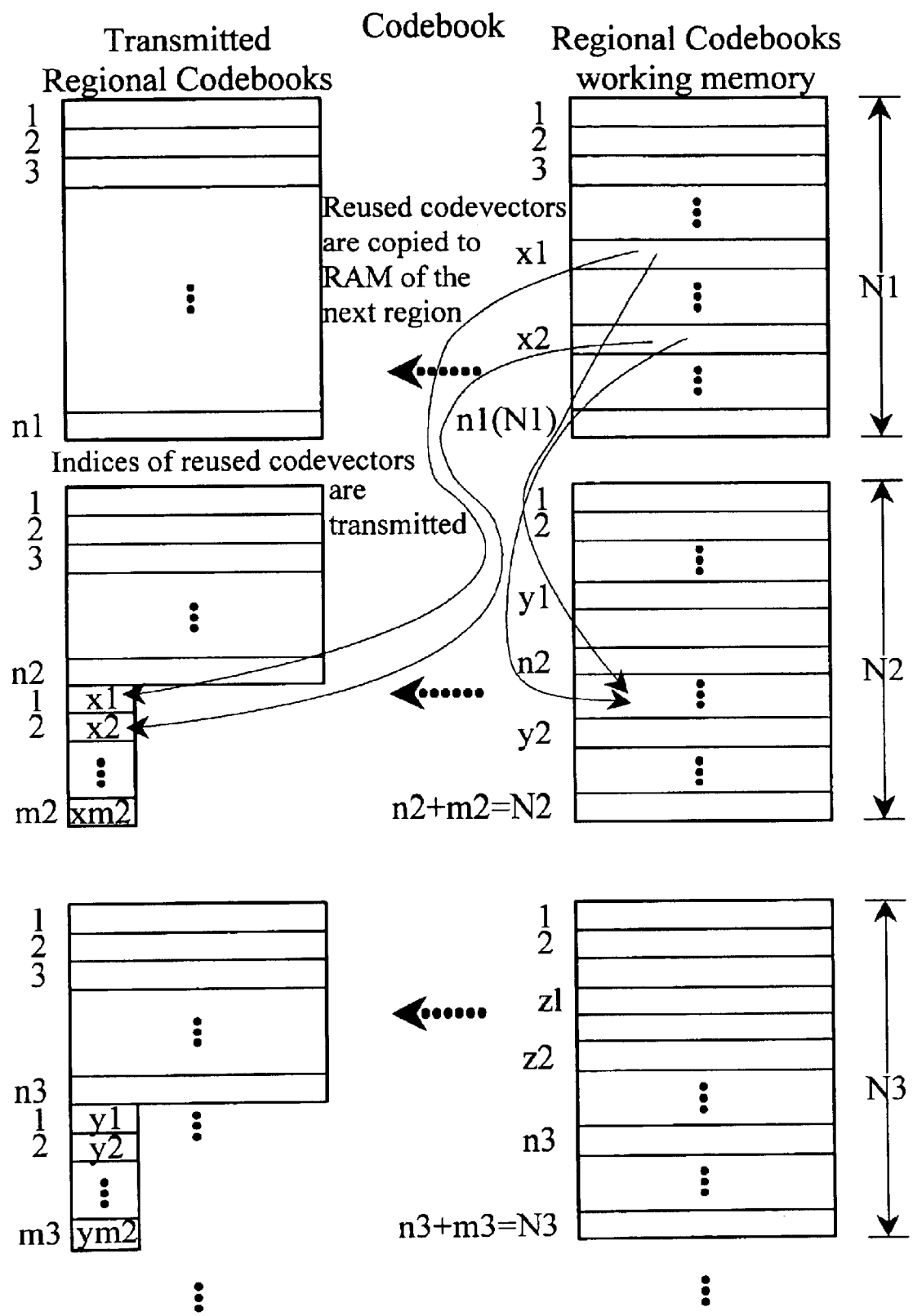
FIG. 1 is a simplified diagram schematically illustrating a data compression process according to the present invention.
Figure 1:
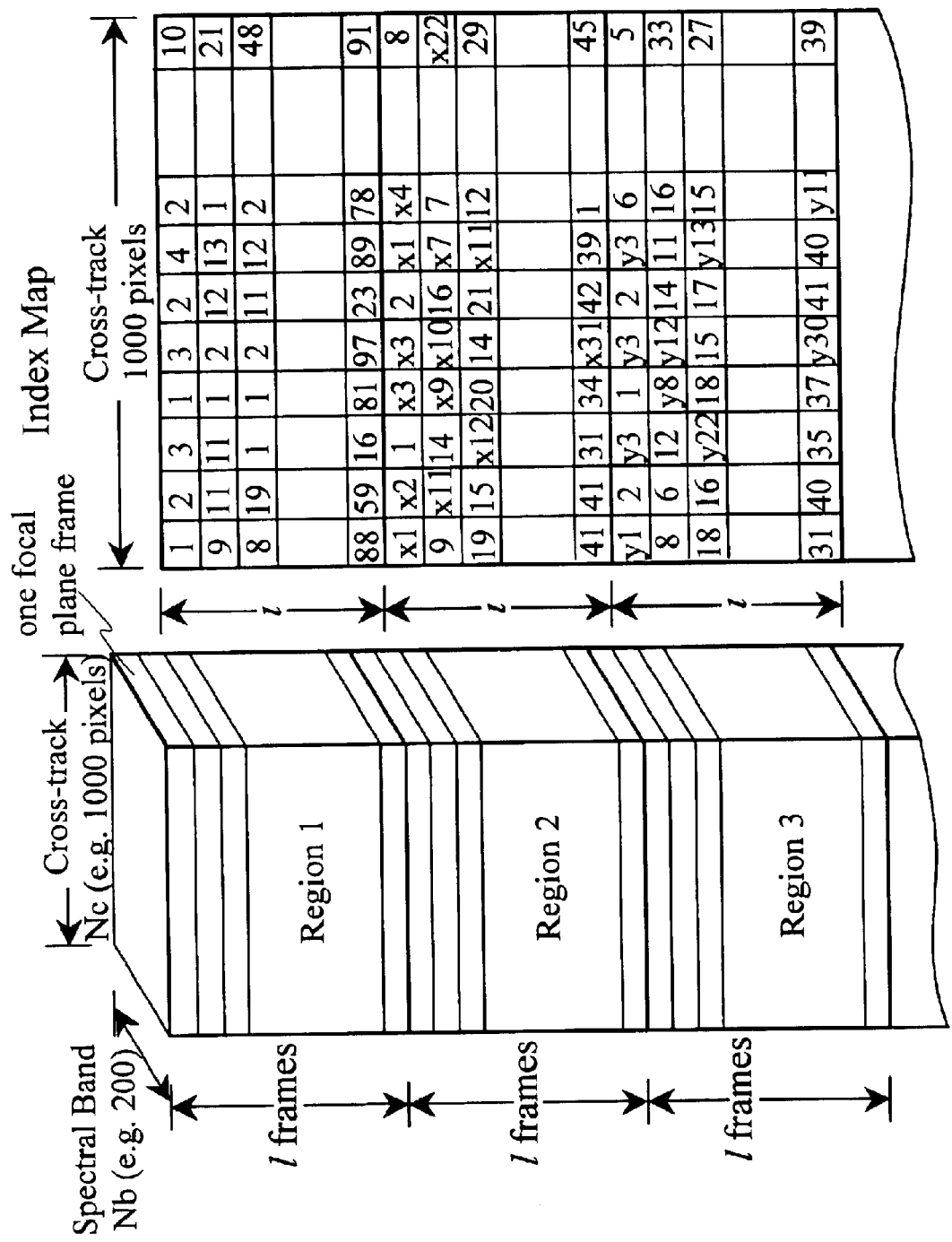

Unlike in applications where a complete data cube is available for compression, in real-time compression onboard a satellite, only a 2D focal plane frame sensed at a given moment from a swath target on ground is available together with the hyper-spectral data corresponding to 2D focal plane frames sensed before. One—spatial—dimension of the 2D focal plane frame corresponds to a line of ground pixels, and another dimension of the 2D focal plane frame corresponds to a spectral vector of each ground pixel. The second spatial dimension of the hyper-spectral data cube is obtained by sensing successive swath targets in along-track direction of the moving satellite producing successive 2D focal plane frames. A series of 2D focal plane frames collected in a given—short—period of time covers an instantaneous scene on the ground—referred to as a region—and is treated as a regional data cube for the purpose of dividing the continuous flow of 2D focal plane frames into data cubes of manageable size for compression. Data compression of a continuous data flow using a lossy compression method such as VQ is, therefore, performed by dividing the continuous data flow into regional data cubes. However, there will be a visible spatial boundary between two adjacent regions in an image after decompression, since the compression of data within each region is independent.

In the following various embodiments of a method for compression of a continuous data flow according to the invention will be disclosed in connection with an example of compressing a continuous flow of hyper-spectral data onboard a satellite. From the description below it will become apparent to those of skill in the art that the method for compressing a continuous data flow according to the invention is not only applicable thereto but in numerous other applications such as MRI imaging systems or CT scanners. The compression is typically performed as soon as sufficient data is present for compression—referred to herein as "real-time"—though some delay is supportable. Of course, any such delay results in increased memory storage requirements for the system.

Lossy data compression based on the VQ process maps a large set of input vectors such as spectral vectors of a hyper-spectral data cube into a small cluster of indexed codevectors forming a codebook. Thus, the spectral vectors of the hyper-spectral data cube are replaced by a codebook comprising indexed codevectors and an index map allocating to each location—pixel—a codevector based on its index, which are then transmitted. Using the codebook and the index map it is possible to reconstruct a hyper-spectral data cube resembling the data cube before compression. Fidelity of the compression strongly depends on the codevectors forming the codebook. Therefore, codebook generation and, in particular, codevector training is a crucial step of the data compression process.

The steps of codebook generation and vector encoding of the various embodiments of the method for compressing a continuous data flow according to the invention have been implemented using the Hierarchical Self-Organizing Cluster Vector Quantization (HSOCVQ) technique disclosed by the inventors in U.S. patent application Ser. No. 09/725,370. In the following it will become apparent to those of skill in the art that the HSOCVQ technique is easily updatet and improved by one of numerous other lossy data compression techniques. Alternatively, another lossy data compression technique is employed.

Figure 2:
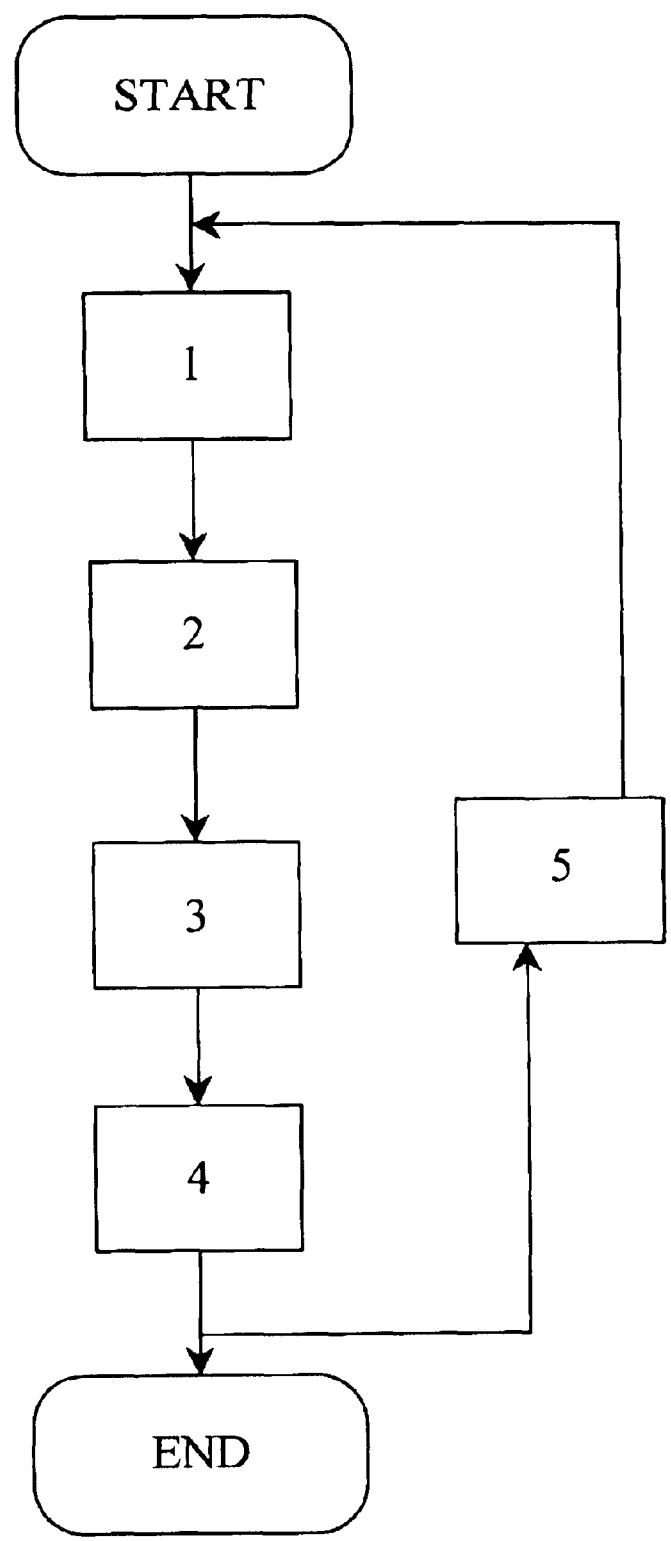
FIG. 2 is a simplified flow diagram of a first embodiment of a method for compressing a continuous data flow in real-time according to the present invention.

Referring to FIGS. 1 and 2, a first embodiment of a method for compressing a continuous data flow in real-time according to the invention is disclosed. Hyper-spectral data are received from a hyper-spectral sensor as a continuous data flow comprising successive 2D focal plane frames 1. Only data of a single 2D focal plane frame are used to train codevectors of that frame 2. Upon codevector training done a codebook is generated 3. The spectral vectors of the single 2D focal plane frame are then encoded and an index map is generated 4. The compression process is repeated for each of the successive 2D focal plane frames 5. In other words, data compression is applied on a frame-by-frame basis. The above method for compressing a continuous data flow in real-time substantially simplifies hardware implementation of real-time data compression and minimizes memory requirements. For example, when a 2D focal plane frame comprises 1000 ground pixels and the spectral vector of a ground pixel has 200 bands with 12-bit data resolution as shown in FIG. 1, the memory required to store the data of a 2D focal plane frame is only 1000×200×12 bits. However, the method has substantially reduced compression ratio, while the fidelity remains constant. Due to the codebook generation and encoding based on a frame-by-frame basis the method does not benefit from the correlation of spectral vectors within a bigger scene.

Figure 3:
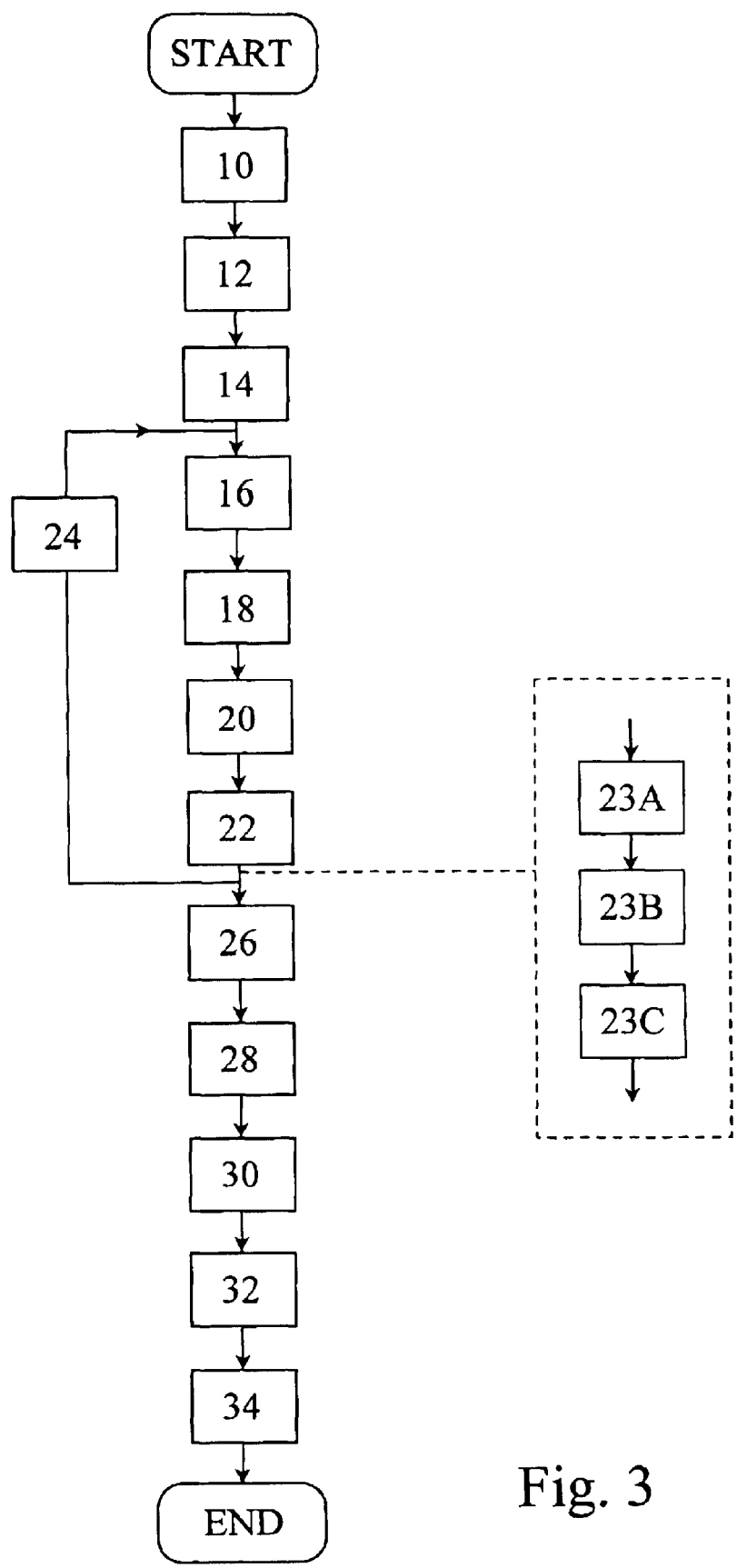
FIG. 3 is a simplified flow diagram of a second embodiment of a method for compressing a continuous data flow in real-time according to the present invention.

This drawback is overcome in a second embodiment of the invention, shown in FIGS. 1 and 3. Correlation is likely strongest between spectral vectors in a current 2D focal plane frame and the spectral vectors in the immediately previous 2D focal plane frame. Therefore, codevectors trained for the immediately previous 2D focal plane frame are reused for encoding a substantial number of spectral vectors in the current 2D focal plane frame with a same predetermined fidelity threshold. Correlation decreases with the separation of the subsequent 2D focal plane frames from the current 2D focal plane frame, i.e. fewer codevectors are used to encode the spectral vectors of widely separated 2D focal plane frames. The number of reused codevectors depends on the predetermined fidelity threshold.

Spectral vectors that are not encoded at a predetermined fidelity by reusing codevectors are encoded separately. Given the fact that the number of un-encoded spectral vectors is small it is not possible to compress these spectral vectors efficiently. There is little correlation between the un-encoded spectral vectors and, furthermore, experimental results have shown that the population of the un-encoded spectral vectors derived from subsequent frames is too small to be trained and encoded. Therefore, only a compression ratio of 1:1 or 2:1 is achievable if they are encoded on a frame-by-frame basis.

The above problem is overcome by collecting a sufficiently large population of un-encoded spectral vectors prior to codevector training and encoding. In this way, a sufficiently high correlation between the spectral vectors is accumulated and, therefore, a high compression ratio is attainable. For example, the un-encoded spectral vectors are collected and encoded at the end of a regional data cube, or after a preset number of frames are encoded.

Referring to FIG. 3, a simplified flow diagram of the second embodiment of the invention is shown. The method is started with the following steps. At 10 a step indicates receipt of a first data subset of the continuous data flow. The first data subset comprises a plurality of data vectors indicative of a first portion of an image of an object. At least a codevector is trained for approximating the data vectors of the plurality of data vectors of the first data subset with fidelity above a predetermined threshold based on the plurality of data vectors of the first data subset at 12. The at least a codevector is stored in a first codebook and an index indicative of the at least a codevector's location within the first codebook is stored in a first index map at 14.

The following data subsets are then processed as described below. At 16, a $n^{th}$ data subset of the continuous data flow is received. The $n^{th}$ data subset comprises a plurality of data vectors indicative of the $n^{th}$ portion of the image of an object. For each data vector of the $n^{th}$ data subset a codevector from a $n-1^{th}$ codebook that approximates the respective data vector is selected at 18. The $n-1^{th}$ codebook comprises codevectors for encoding at least a portion of the data vectors of the $n-1^{th}$ data subset. Fidelity for the approximation of each data vector of the $n^{th}$ data subset is determined at 20. When fidelity for the approximation of a data vector of the $n^{th}$ data subset is above a predetermined threshold the data vector is encoded based on the selected codevector at 22. The steps shown from 16 to 22 are repeated for processing subsequent data subsets at 24. Un-encoded data vectors are collected and at least a codevector for approximating each of the un-encoded data vectors with fidelity above the predetermined threshold based on the collected un-encoded data vectors is trained at 26 and 28. The un-encoded data vectors are collected until a sufficiently large number of un-encoded data vectors for codevector training are accumulated or, for example, after a predetermined number of data subsets have been processed. The at least a trained codevector is stored in the respective codebook at 30 and each of the un-encoded data vectors is encoded based on the respective codevector of the at least a trained codevector at 32. For each codevector used in encoding a data vector, an index indicative of the codevector's location within the respective codebook is stored in an index map. The codebook and the index map are then provided for transmission at 34 on, for example, a frame-by-frame basis or, alternatively, after a preset number of data subsets.

Optionally, when the fidelity for the approximation of a data vector of the $n^{th}$ data subset at 22 is below the predetermined threshold a second codevector from the $n-2^{th}$ codebook that approximates the data vector is selected 23A. A fidelity for the second approximation of the data vector is then determined at 23B and when the fidelity for the second approximation of the data vector is above the predetermined threshold the data vector is encoded based on the selected second codevector at 23C. These steps are repeated for subsequent data subsets.

The second embodiment of the invention has several advantages. The codevector training is substantially faster than the codevector training for a complete hyper-spectral data cube since the training set is substantially smaller—a single 2D focal plane frame instead of a hyper-spectral data cube. The codevectors trained are used highly efficiently, because they are not only used to encode the spectral vectors in the 2D focal plane frame they have been trained for but to encode spectral vectors in subsequent 2D focal plane frames. The method provides a recursive process for encoding a large hyper-spectral data cube while only a relatively small portion of the spectral vectors is used for codevector training.

Figure 4:
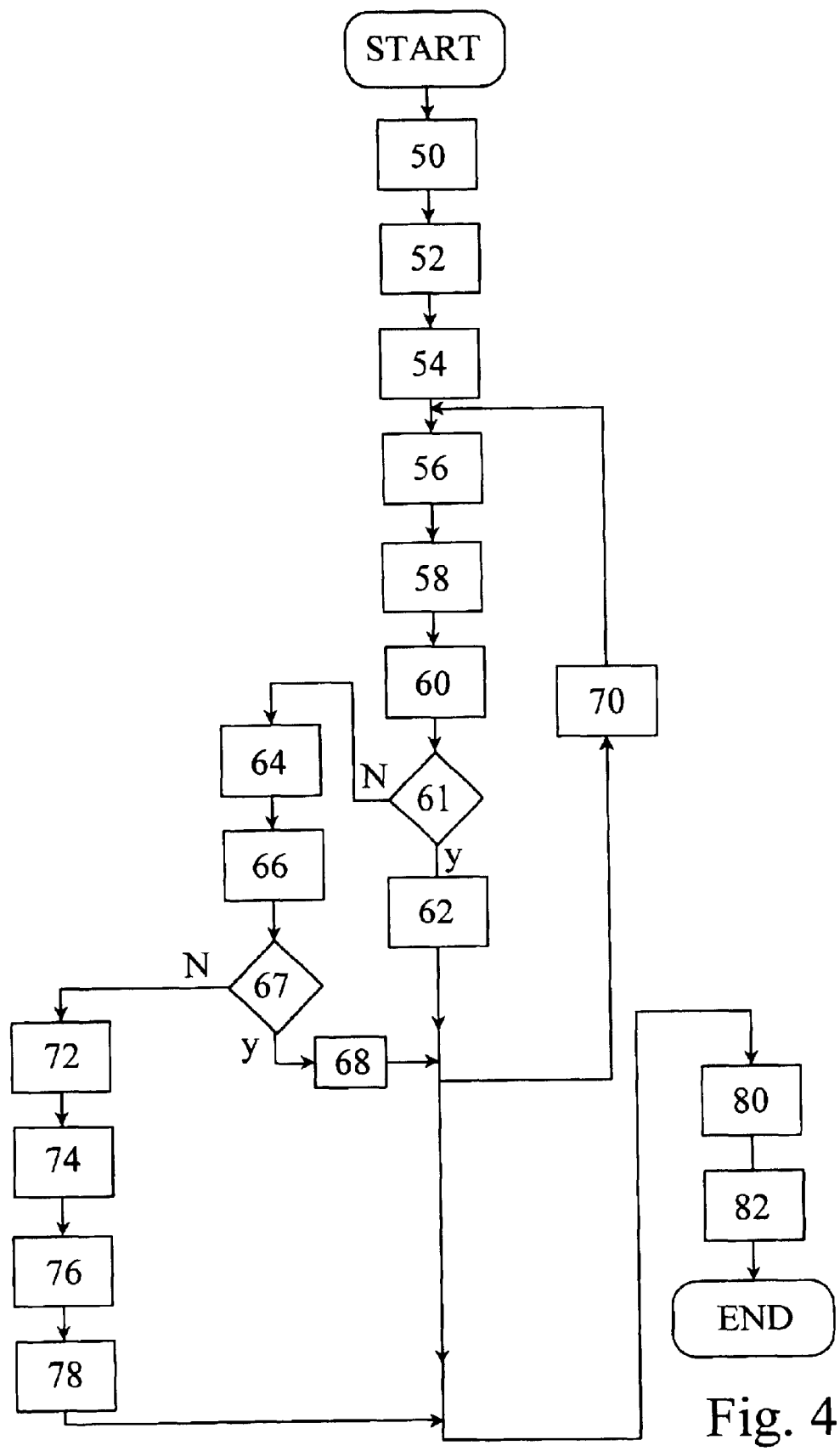
FIG. 4 is a simplified flow diagram of a third embodiment of a method for compressing a continuous data flow in real-time according to the present invention.

Referring to FIGS. 1 and 4, a third embodiment of the invention is shown. In real-time data compression, a series of 2D focal plane frames acquired in a given period of time are treated as a regional data cube for the purpose of dividing a continuous series of 2D focal plane frames into a plurality of data cubes. There will be a visible spatial boundary between two adjacent regions after the data are decompressed, since the compression of each region is independent. There is the possibility that artifacts such as these are unacceptable to a user. The problem is overcome by reusing the codevectors trained from a previous region to encode the spectral vectors in the current region in order to attain a seamless conjunction of the two adjacent regions. Because the boundary is artificial, the spectral vectors in a boundary area comprising the last few frames of the previous region and the first few frames of the current region are likely similar. Therefore, the same codevectors are used to encode the spectral vectors of both regions in and around the boundary area. Artifacts are removed or substantially reduced since the same codevectors are used.

The order of reuse of existing codevectors is important in achieving high compression performance. For encoding spectral vectors on a frame-by-frame basis in a current region there exist two types of codevectors: i) codevectors that have been newly trained for previous 2D focal plane frames in the current region and ii) codevectors trained for the previous region. If it is possible to encode a spectral vector with a reused codevector the spectral vector is encoded with a codevector from one source, i) or ii). Test results have shown that preferred reuse of type i) codevectors produces better compression performance. Therefore, type i) codevectors are first selected for reuse to encode spectral vectors of a given 2D focal plane frame. There are three reasons for preferring type i) codevectors. Firstly, the codevectors newly trained from the 2D focal plane frames of the current region have a higher correlation with the spectral vectors in the current frame than codevectors trained for the previous region. They yield better fidelity when reused to encode the spectral vectors of the current frame. Secondly, if a spectral vector is encoded by reusing a codevector from the newly trained codevectors of the current region, there is no need to search through the codebook of the previous region. This saves compression time for encoding the spectral vector since the size of the current regional codebook is smaller than the codebook of the previous region. Thirdly, if a spectral vector is encoded by reusing a type i) codevector, the codevector need not be transferred from the codebook of the previous region. Otherwise, the reused codevector in the previous regional codebook is carried forward to the current regional codebook increasing the size of the current regional codebook and reducing the compression ratio.

Referring to FIG. 4, a simplified flow diagram of an embodiment of the invention is shown. The compression process is started with the following steps. At 50 a first step indicates receipt of a first data subset of the continuous data flow. The first data subset comprises a plurality of data vectors indicative of a first portion of a first region of an image of an object. At least a codevector is trained for approximating the data vectors of the plurality of data vectors of the first data subset with fidelity above a predetermined threshold based on the plurality of data vectors of the first data subset at 52. The at least a codevector is stored in a first regional codebook and an index indicative of the at least a codevector's location within the first regional codebook is stored in a first regional index map at 54.

The following data subsets are then processed as described below. At 56, the $n^{th}$ data subset of the $m^{th}$ region of the continuous data flow is received. The $n^{th}$ data subset comprises a plurality of data vectors indicative of the $n^{th}$ portion of the $m^{th}$ region of the image of an object. Referring to 58, a codevector is selected for each data vector of the $n^{th}$ data subset of the $m^{th}$ region from the $m^{th}$ regional codebook that approximates the respective data vector. The $m^{th}$ regional codebook comprises codevectors for encoding at least a portion of the data vectors of at least a data subset of the first to the $n-1^{th}$ data subsets of the $m^{th}$ region. Fidelity for the approximation of each data vector of the $n^{th}$ data subset of the $m^{th}$ region is then determined in the following step at 60. At 61 when fidelity for the approximation of a data vector of the $n^{th}$ data subset of the $m^{th}$ region is above a predetermined threshold, the data vector is encoded based on the selected codevector at 62. At 61 when fidelity for the approximation of a data vector of the $n^{th}$ data subset of the $m^{th}$ region is below the predetermined threshold, a second codevector is selected from the $m-1^{th}$ regional codebook that approximates the data vector at 64. Fidelity for the second approximation of the data vector is then determined at 66. At 67, when fidelity for the second approximation of the data vector is above the predetermined threshold the data vector is encoded based on the selected second codevector at 68. The steps 56 to 68 are repeated for encoding data vectors of subsequent data subsets within the $m^{th}$ region at 70. Un-encoded data vectors of subsequent data subsets are collected for codevector training at 72. The un-encoded data vectors are collected until a sufficiently large number of un-encoded data vectors for codevector training are accumulated or, for example, after a predetermined number of data subsets such as the number of data subsets within a region have been processed. At least a codevector is trained for approximating each of the un-encoded data vectors with fidelity above the predetermined threshold based on the collected un-encoded data vectors at 74. The at least a trained codevector is stored in the $m^{th}$ regional codebook at 76—and each of the un-encoded data vectors is encoded based on the respective codevector of the at least a trained codevector at 78. For each codevector used in encoding a data vector, an index indicative of the codevector's location within the respective regional codebook is stored in a regional index map at 80. The regional codebooks and the regional index map are then provided for transmission at 82. Preferably, the regional codebooks and the regional index map are provided after processing of a regional data cube.

Below two processes for forwarding reused type ii) codevectors are described. In accordance with the first process, only the index of a reused type ii) codevector is transmitted together with the codevectors trained for the current region, as illustrated in FIG. 1. The first column in FIG. 1 shows the transmitted regional codebooks. The second column shows the working memory of the regional codebooks. For example, codevector x1 is reused in encoding a spectral vector in the current region. Therefore, its index in the codebook of the previous region "x1" —8 bits for a codebook size of 256 codevectors—is transmitted instead of the entire codevector—200×12 bits for a vector having 200 spectral bands with 12 bit data resolution. During the decompression process, the recorded index x1 points to the corresponding codevector in the previous regional codebook. Using this process, all the reused type ii) codevectors need not be transmitted with the codebook of the current region. This substantially increases the compression ratio, since an index requires only 1 byte as compared to 300 bytes for the exemplary codevector described. During recursive decompression, not only the current regional codebook but also the previous regional codebook is used, thus this process is referred to as "associated codebook" process. A current regional codebook is always associated with the codebook of the previous region. Upon completing the compression of spectral vectors of the current region, all of the reused codevectors from the previous region are copied and appended to the working memory of the current regional codebook. Therefore, processing of the following region is facilitated by organizing all codevectors used for encoding the spectral vectors of the current region into a current regional codebook. During the compression process for spectral vectors within the following region, all the codevectors stored in the current regional codebook—newly trained or carried forward from the previous codebook—are checked for reuse as type ii) codevectors.

Figure 5:
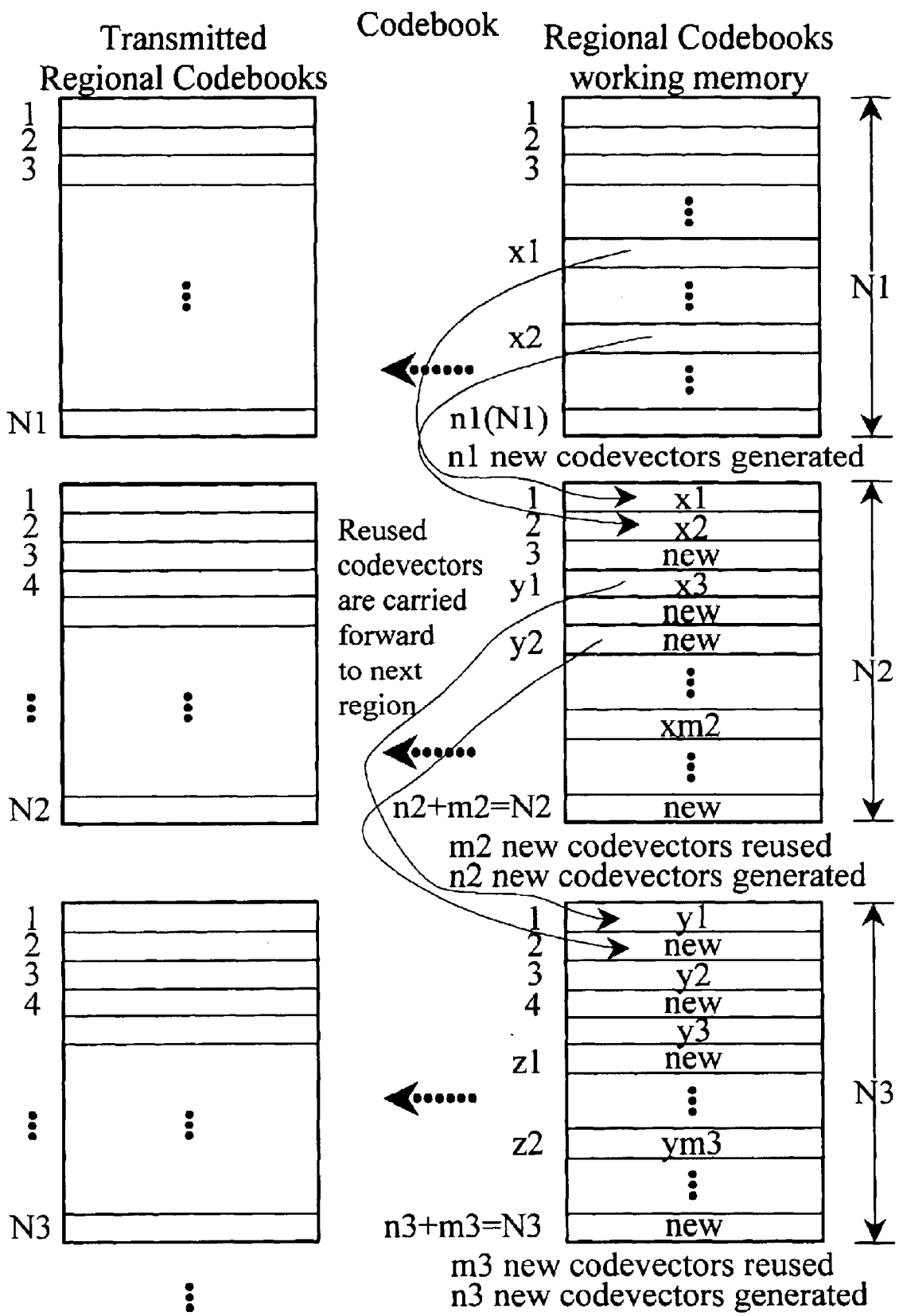
FIG. 5 is a simplified diagram schematically illustrating a data compression process according to the present invention.
Figure 5:
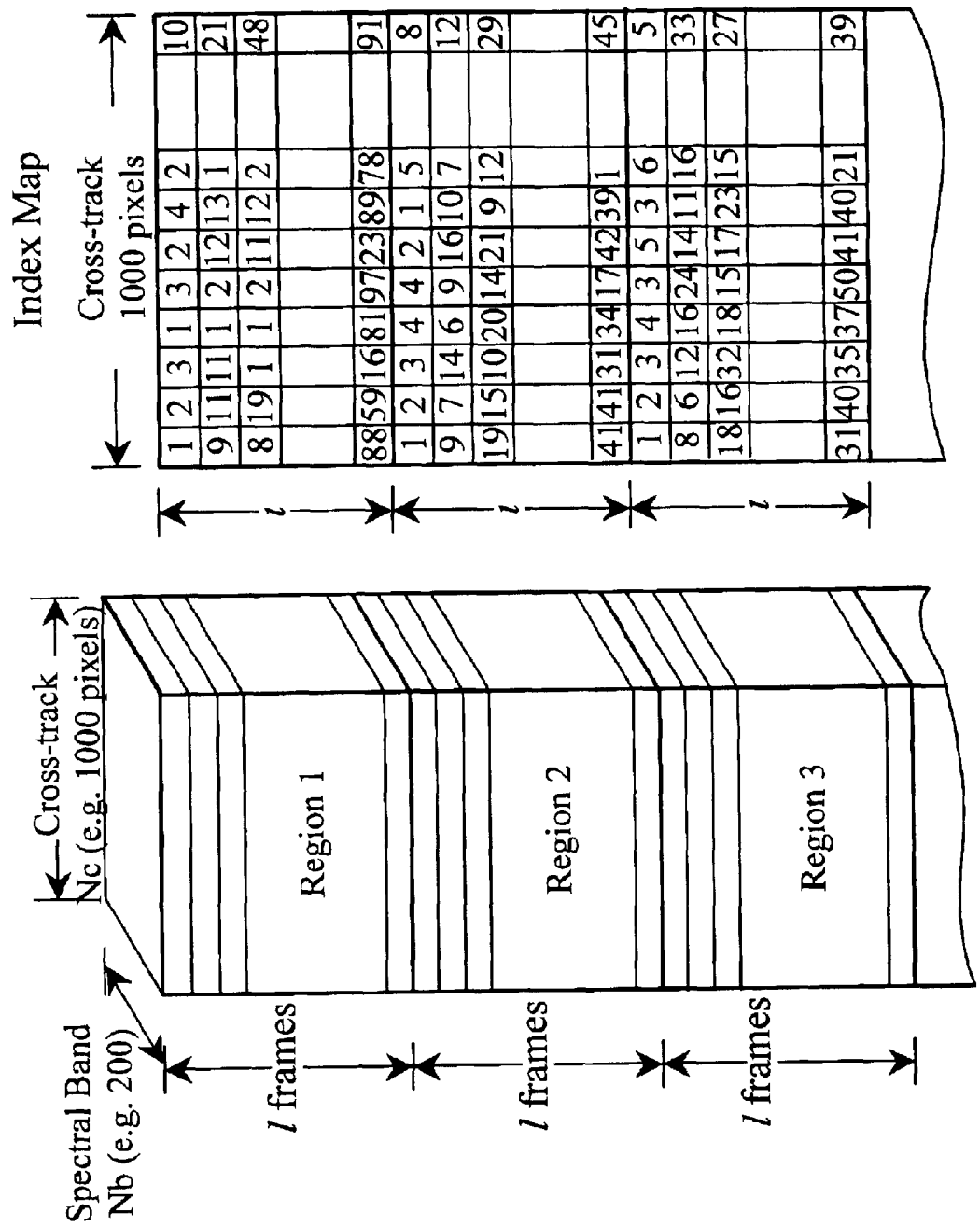

In accordance with the second process, a codevector from the previous regional codebook is carried forward to the working memory of the current regional codebook as soon as it is reused, as shown in FIG. 5. Upon completing the compression of the current region, the codevectors in the working memory of the current regional codebook comprise type i) as well as type ii) codevectors. All of the codevectors in the working memory are transmitted. In this process the codebook of each region is independent since all the reused codevectors are included therein. For example, reused codevectors "x1" and "x2" are carried forward to the working memory of the current region as soon as they are reused and are stored as codevectors of the current regional codebook. During the decompression process, spectral vectors of a region are reconstructed using only the codebook of that region. The advantage of this process is protection against error propagation as errors are constrained to a regional data cube if bit errors occur within a codevector of a codebook that is later reused.

Table 1 shows a comparison of the compression performance for different embodiments of the invention using the HSOCVQ technique with data compression applied in batch mode. The hyper-spectral data have been acquired with approximately 20 m ground resolution in 224 spectral bands, each about 10 nm wide in the 400 nm to 2500 nm wavelength range. The spatial size was 614 pixels by 512 lines corresponding to an area of 12.3 km×10.2 km. Data file size was 140 Mbytes. The experimental results show that the method for compressing a continuous data flow in real-time according to the present invention using the HSOCVQ technique performs as well as the HSOCVQ technique applied in the batch mode, despite the fact that the correlation between the spectral vectors is substantially reduced due to the codevector training being performed in a single frame. Therefore, the method is highly advantageous in numerous applications such as spectral imaging or MRI imaging for compressing large data sets either in real-time or otherwise with a high compression ratio.

TABLE 1

|  | HSOCVQ (Batch Mode) | | | | HSOCVQ (Recursive Mode for Real-Time Application) | | | |
| --- | --- | --- | --- | --- | --- | --- | --- | --- |
| Compression Ratio | 10:1 | 20:1 | 30:1 | 40:1 | 10:1 | 20:1 | 30:1 | 40:1 |
| PSNR (dB) | 58.35 | 56.2 | 55.23 | 54.64 | 57.95 | 56.1 | 55.05 | 54.32 |
| RMSE | 39.64 | 50.57 | 56.67 | 60.65 | 41.50 | 51.58 | 58.13 | 63.06 |
| SNR (dB) | 41.95 | 39.83 | 38.83 | 38.12 | 41.55 | 39.66 | 38.62 | 37.92 |

Figure 6A:
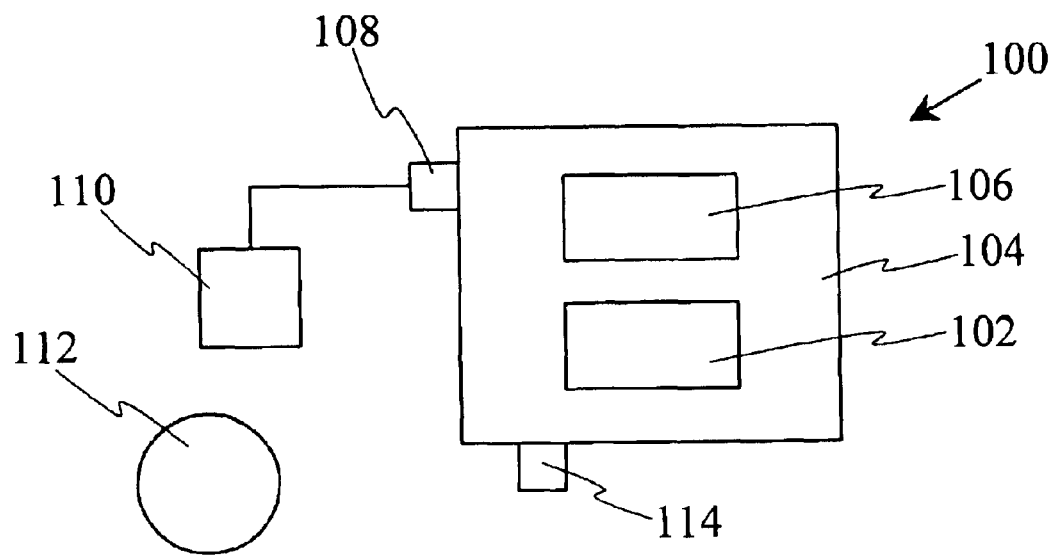
FIG. 6a is a simplified block diagram of a system implementation of the method for compressing a continuous data flow in real-time according to the present invention; and, FIG. 6b is a simplified block diagram of another system implementation of the method for compressing a continuous data flow in real-time according to the present invention.

Referring to FIGS. 6a arid 6b, system implementations 100 and 200 of the various embodiments of the invention are shown. For example, executable commands for execution on a processor 102 of a computer 104 are stored in non-volatile memory 106, as shown in FIG. 6a. When executing the stored commands the processor 102 preferably performs the processing steps of one of the above described embodiments. The computer is linked via port 108 to an imaging system 110 for data communication therewith. Data subsets acquired from an object 112 are transmitted via port 108 to the workstation 104 for processing, for example in real-time. The compressed data—codebooks and index maps—are provided via port 114 for transmission.

Figure 6B:
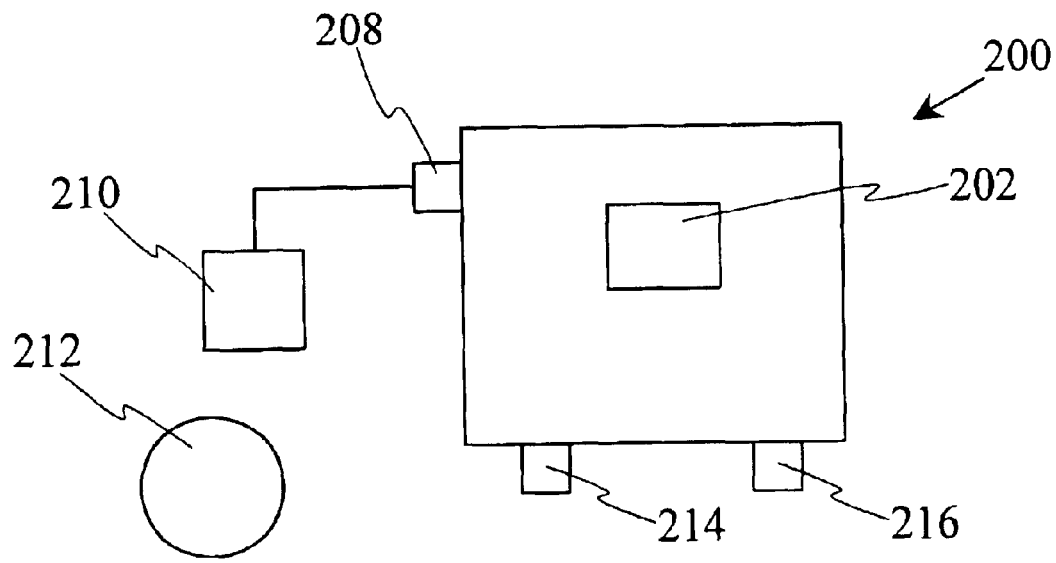

Alternatively, shown in FIG. 6b, the method is realized based on a hardware system implementation 200. Data subsets acquired from an object 212 are received, for example in real-time via port 208 from an imaging system 210. Electronic circuitry 202 performs the processing steps of one of the above-described embodiments. The compressed data—codebooks and index maps—are provided, for example in real-time, via port 214 for transmission. Control commands, such as commands for initializing a compression process, are received from a data communication medium via port 216.

The various embodiments of the method for compressing a continuous data flow in real-time allow implementation in autonomously operating systems, which are highly advantageous in, for example, space applications, medical applications and so forth.

Of course, numerous other embodiments of the invention will be apparent to persons skilled in the art without departing from the spirit and scope of the invention as defined in the appended claims.

What is claimed is:

1. A method for compressing a continuous data flow comprising the steps of:
   a) receiving a $n^{th}$ data subset of the continuous data flow, the $n^{th}$ data subset comprising a plurality of data vectors indicative of a $n^{th}$ portion of an image of an object;
   b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;
   c) determining a fidelity for the approximation of each data vector of the $n^{th}$ data subset; and,
   d) when the fidelity for the approximation of a data vector of the $n^{th}$ data subset is above a predetermined threshold performing the step of encoding the data vector based on the selected codevector.

2. A method for compressing a continuous data flow as defined in claim 1 comprising the step of:
   e) repeating the steps a) to d) for encoding data vectors of a $n+1^{th}$ data subset received subsequent to the $n^{th}$ data subset.

3. A method for compressing a continuous data flow as defined in claim 2 comprising the steps of:
   f) determining un-encoded data vectors from at least two data subsets;
   g) determining at least a codevector through training for approximating the un-encoded data vectors with a fidelity above the predetermined threshold based on the collected un-encoded data vectors;
   i) storing the at least a trained codevector in the respective codebook; and,
   j) encoding each of the un-encoded data vectors based on a codevector of the at least a trained codevector.

4. A method for compressing a continuous data flow as defined in claim 3 wherein in step f) the determined un-encoded data vectors are collected until a sufficiently large number of un-encoded data vectors suitable for codevector training is accumulated.

5. A method for compressing a continuous data flow as defined in claim 4 wherein step g) is performed after a predetermined number of data subsets have been processed.

6. A method for compressing a continuous data flow in real-time as defined in claim 5 comprising the steps of:
   storing in an index map an index indicative of a codevector's location within the respective codebook; and,
   providing the index map and the respective codebook for transmission after the predetermined number of data subsets have been processed.

7. A method for compressing a continuous data flow as defined in claim 6 comprising the steps of:
   receiving the first data subset of the continuous data flow, the first data subset comprising a plurality of data vectors indicative of the first portion of the image of an object;
   determining a plurality of codevectors through training for approximating the data vectors of the plurality of data vectors of the first data subset with a fidelity above a predetermined threshold based on the plurality of data vectors of the first data subset;
   encoding the data vectors based on the plurality of codevectors; and,
   storing the plurality of codevectors in a first codebook and storing in a first index map an index indicative of a codevector's location within the first codebook.

8. A method for compressing a continuous data flow as defined in claim 1 comprising the steps of:
   e) when the fidelity for the approximation of a data vector of the $n^{th}$ data subset is below the predetermined threshold performing the step of selecting a second codevector from the $n-2^{th}$ codebook that approximates the data vector;
   f) determining a fidelity for the second approximation of the data vector; and,
   g) when the fidelity for the second approximation of the data vector is above the predetermined threshold performing the step of encoding the data vector based on the selected second codevector.

9. A method for compressing a continuous data flow as defined in claim 8 comprising the step of:
   h) repeating the steps a) to g) for encoding data vectors of data subsets received subsequent to the $n^{th}$.

10. A method for compressing a continuous data flow comprising the steps of:
    a) receiving a $n^{th}$ data subset of a $m^{th}$ region of the continuous data flow, the $n^{th}$ data subset comprising a plurality of data vectors indicative of a $n^{th}$ portion of a $m^{th}$ region of an image of an object;
    b) selecting for each data vector of the $n^{th}$ data subset of the $m^{th}$ region a codevector from a $m^{th}$ regional codebook that approximates the respective data vector, the $m^{th}$ regional codebook being different from the $m-1^{th}$ regional codebook, the $m^{th}$ regional codebook comprising codevectors for encoding at least a portion of the data vectors of at least a data subset of the first to the $n-1^{th}$ data subsets of the $m^{th}$ region;
    c) determining a fidelity for the approximation of each data vector of the $n^{th}$ data subset of the $m^{th}$ region; and,
    d) when the fidelity for the approximation of a data vector of the $n^{th}$ data subset of the $m^{th}$ region is above a predetermined threshold performing the step of encoding the data vector based on the selected codevector.

11. A method for compressing a continuous data flow as defined in claim 10 comprising the step of:
    d1) storing in a $m^{th}$ regional index map an index indicative of the codevector's location within the $m^{th}$ regional codebook.

12. A method for compressing a continuous data flow as defined in claim 11 comprising the steps of:
    e) when the fidelity for the approximation of a data vector of the $n^{th}$ data subset of the $m^{th}$ region is below the predetermined threshold performing the step of selecting a second codevector from the $m-1^{th}$ regional codebook that approximates the data vector;

f) determining a fidelity for the second approximation of the data vector; and, g) when the fidelity for the second approximation of the data vector is above the predetermined threshold performing the step of encoding the data vector based on the selected second codevector.

13. A method for compressing a continuous data flow as defined in claim 12 comprising the steps of:

h) providing an index indicative of the second codevector's location within the m−1$^{th}$ regional codebook for transmission;

i) providing a copy of the second codevector to the m$^{th}$ regional codebook stored in working memory;

j) storing a copy of the second codevector in the m$^{th}$ regional codebook; and, k) storing in the m$^{th}$ regional index map an index indicative of the second codevector's location within the m$^{th}$ regional.

14. A method for compressing a continuous data flow as defined in claim 13 comprising the step of:

l) repeating the steps a) to k) for encoding data vectors of a n+1$^{th}$ data subset received subsequent to the n$^{th}$ data subset within the m$^{th}$ region.

15. A method for compressing a continuous data flow as defined in claim 14 comprising the steps of:

m) determining un-encoded data vectors from at least two data subsets;

n) determining at least a codevector through training for approximating the un-encoded data vectors with a fidelity above the predetermined threshold based on the collected un-encoded data vectors;

o) storing the at least a trained codevector in the m$^{th}$ regional codebook; and, l) encoding each of the un-encoded data vectors using the respective codevector of the at least a trained codevectors.

16. A method for compressing a continuous data flow as defined in claim 15 wherein in step m) the determined un-encoded data vectors are collected until a sufficiently large number of un-encoded data vectors suitable for codevector training is accumulated.

17. A method for compressing a continuous data flow as defined in claim 16 wherein step n) is performed after a predetermined number of data subsets have been processed.

18. A method for compressing a continuous data flow as defined in claim 17 wherein the predetermined number of data subsets is the number of data subsets within the m$^{th}$ region.

19. A method for compressing a continuous data flow as defined in claim 15 comprising the step of:

p) storing in the m$^{th}$ regional index map at least an index indicative of the at least a trained codevector's location within the m$^{th}$ regional codebook.

20. A method for compressing a continuous data flow as defined in claim 18 comprising the step of:

q) providing the m$^{th}$ regional codebook and the m$^{th}$ regional index map for transmission.

21. A method for compressing a continuous data flow as defined in claim 20 wherein the steps a) to q) are repeated for subsequent regions.

22. A method for compressing a continuous data flow as defined in claim 21 wherein same codevectors are used for encoding the data vectors in boundary areas connecting two adjacent regions, the boundary areas comprising at least the last data subset of the m$^{th}$ region and at least the first data subset of the m+1$^{th}$ region.

23. A method for compressing a continuous data flow as defined in claim 22 comprising the steps of:

receiving the first data subset of the first region of the continuous data flow, the first data subset comprising a plurality of data vectors indicative of the first portion of the first region of the image of an object;

determining a plurality of codevectors through training for approximating the data vectors of the plurality of data vectors of the first data subset with a fidelity above a predetermined threshold based on the plurality of data vectors of the first data subset;

encoding the data vectors based on the plurality of codevectors; and, storing the plurality of codevectors in the first regional codebook and storing in the first regional index map an index indicative of a codevector's location within the first regional codebook.

24. A method for compressing a continuous data flow as defined in claim 12 wherein the steps b) to g) are implemented using HSOCVQ.

25. A method for compressing a continuous data flow as defined in claim 12 wherein each data vector of the plurality of data vectors comprises imaging data corresponding to a respective image pixel of a plurality of image pixels.

26. A method for compressing a continuous data flow as defined in claim 25 wherein the plurality of image pixels are arranged in a line oriented in across-track direction.

27. A method for compressing a continuous data flow as defined in claim 26 wherein the data vectors comprise hyper-spectral vectors.

28. A storage medium having stored thereon at least an executable command for when executed resulting in performance of the steps of:

a) receiving a n$^{th}$ data subset of a m$^{th}$ region of the continuous data flow, the n$^{th}$ data subset comprising a plurality of data vectors indicative of a n$^{th}$ portion of a m$^{th}$ region of an image of an object;

b) selecting for each data vector of the n$^{th}$ data subset of the m$^{th}$ region a codevector from a m$^{th}$ regional codebook that approximates the respective data vector, the m$^{th}$ regional codebook comprising codevectors for encoding at least a portion of the data vectors of the first to the n−1$^{th}$ data subsets of the m$^{th}$ region;

c) determining a fidelity for the approximation of each data vector of the n$^{th}$ data subset of the m$^{th}$ region;

d) when the fidelity for the approximation of a data vector of the n$^{th}$ data subset of the m$^{th}$ region is above a predetermined threshold performing the step of encoding the data vector using the selected codevector and storing in a m$^{th}$ regional index map an index indicative of the selected codevector's location within the m$^{th}$ regional codebook;

e) when the fidelity for the approximation of a data vector of the n$^{th}$ data subset of the m$^{th}$ region is below the predetermined threshold performing the step of selecting a second codevector from the m−1$^{th}$ regional codebook that approximates the data vector;

f) determining a fidelity for the second approximation of the data vector;

g) when the fidelity for the second approximation of the data vector is above the predetermined threshold performing the step of encoding the data vector based on the selected second codevector, storing a copy of the second codevector in the m$^{th}$ regional codebook, storing in the m$^{th}$ regional index map an index indicative of the second codevector's location within the m$^{th}$ regional;

h) repeating the steps a) to g) for encoding data vectors of subsequent data subsets within the $m^{th}$ region;

i) collecting un-encoded data vectors of subsequent data subsets;

j) determining at least a codevector through training for approximating the un-encoded data vectors with a fidelity above the predetermined threshold based on the collected un-encoded data vectors;

k) storing the at least a trained codevector in the $m^{th}$ regional codebook;

l) encoding each of the un-encoded data vectors based on the respective codevector of the at least a trained codevectors;

n) providing the $m^{th}$ regional codebook and the $m^{th}$ regional index map for transmission; and, repeating the steps a) to n) for subsequent regions.

29. A system for compressing a continuous data flow comprising:

a first port for receiving the continuous data flow; electronic circuitry in data communication with the first port, the electronic circuitry for performing the steps of:

a) receiving a $n^{th}$ data subset of a $m^{th}$ region of the continuous data flow, the $n^{th}$ data subset comprising a plurality of data vectors indicative of a $n^{th}$ portion of a $m^{th}$ region of an image of an object;

b) selecting for each data vector of the $n^{th}$ data subset of the $m^{th}$ region a codevector from a $m^{th}$ regional codebook that approximates the respective data vector, the $m^{th}$ regional codebook comprising codevectors for encoding at least a portion of the data vectors of the first to the $n-1^{th}$ data subsets of the $m^{th}$ region;

c) determining a fidelity for the approximation of each data vector of the $n^{th}$ data subset of the $m^{th}$ region;

d) when the fidelity for the approximation of a data vector of the $n^{th}$ data subset of the $m^{th}$ region is above a predetermined threshold performing the step of encoding the data vector based on the selected codevector, and storing in a $m^{th}$ regional index map an index indicative of the selected codevector's location within the $m^{th}$ regional codebook;

e) when the fidelity for the approximation of a data vector of the $n^{th}$ data subset of the $m^{th}$ region is below the predetermined threshold performing the step of selecting a second codevector from the $m-1^{th}$ regional codebook that approximates the data vector;

f) determining a fidelity for the second approximation of the data vector;

g) when the fidelity for the second approximation of the data vector is above the predetermined threshold performing the step of encoding the data vector based on the selected second codevector, storing a copy of the second codevector in the $m^{th}$ regional codebook, storing in the $m^{th}$ regional index map an index indicative of the second codevector's location within the $m^{th}$ regional;

h) repeating the steps a) to g) for encoding data vectors of subsequent data subsets within the $m^{th}$ region;

i) collecting un-encoded data vectors of subsequent data subsets;

j) determining at least a codevector through training for approximating the un-encoded data vectors with a fidelity above the predetermined threshold based on the collected un-encoded data vectors;

k) storing the at least a trained codevector in the $m^{th}$ regional codebook;

l) encoding each of the un-encoded data vectors based on the respective codevector of the at least a trained codevectors;

n) providing the $m^{th}$ regional codebook and the $m^{th}$ regional index map for transmission; and, repeating the steps a) to n) for subsequent regions; and, a second port in data communication with the electronic circuitry for providing the regional codebook and the regional index map.

30. A storage medium having stored thereon at least an executable command for when executed resulting in performance of the steps of:

a) receiving a $n^{th}$ data subset of the continuous data flow, the $n^{th}$ data subset comprising a plurality of data vectors indicative of a $n^{th}$ portion of an image of an object;

b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;

c) determining a fidelity for the approximation of each data vector of the $n^{th}$ data subset;

d) when the fidelity for the approximation of a data vector of the $n^{th}$ data subset is above a predetermined threshold performing the step of encoding the data vector based on the selected codevector;

e) repeating the steps a) to d) for encoding data vectors of subsequent data subsets;

f) determining un-encoded data vectors from at least two data subsets;

g) determining at least a codevector through training for approximating each of the un-encoded data vectors with a fidelity above the predetermined threshold based on the collected un-encoded data vectors;

i) storing the at least a trained codevector in the respective codebook;

j) encoding the un-encoded data vectors based on the at least a trained codevector; and, storing in an index map an index indicative of a codevector's location within the respective codebook.

31. A system for compressing a continuous data flow comprising:

a first port for receiving the continuous data flow; electronic circuitry in data communication with the first port, the electronic circuitry for performing the steps of:

a) receiving a $n^{th}$ data subset of the continuous data flow, the $n^{th}$ data subset comprising a plurality of data vectors indicative of a $n^{th}$ portion of an image of an object;

b) selecting for each data vector of the $n^{th}$ data subset a codevector from a $n-1^{th}$ codebook that approximates the respective data vector, the $n-1^{th}$ codebook comprising codevectors for encoding at least a portion of the data vectors of the $n-1^{th}$ data subset;

c) determining a fidelity for the approximation of each data vector of the $n^{th}$ data subset;

d) when the fidelity for the approximation of a data vector of the $n^{th}$ data subset is above a predetermined threshold performing the step of encoding the data vector based on the selected codevector;

e) repeating the steps a) to d) for encoding data vectors of subsequent data subsets;

f) determining un-encoded data vectors from at least two data subsets;

g) determining at least a codevector through training for approximating each of the un-encoded data vectors with a fidelity above the predetermined threshold based on the collected un-encoded data vectors;

i) storing the at least a trained codevector in the respective codebook;

j) encoding the un-encoded data vectors based on the at least a trained codevector; and, storing in an index map an index indicative of a codevector's location within the respective codebook; and, a second port in data communication with the electronic circuitry for providing the codebook and the index map.

* * * * *